(12) United States Patent
Rathsack et al.

(10) Patent No.: US 7,807,343 B2
(45) Date of Patent: Oct. 5, 2010

(54) EDA METHODOLOGY FOR EXTENDING GHOST FEATURE BEYOND NOTCHED ACTIVE TO IMPROVE ADJACENT GATE CD CONTROL USING A TWO-PRINT-TWO-ETCH APPROACH

(75) Inventors: Benjamen Michael Rathsack, Richardson, TX (US); James Walter Blatchford, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 594 days.

(21) Appl. No.: 11/621,605

(22) Filed: Jan. 10, 2007

(65) Prior Publication Data
US 2008/0166889 A1 Jul. 10, 2008

(51) Int. Cl.
  G03C 5/00 (2006.01)
  G03F 1/00 (2006.01)
  G03F 7/00 (2006.01)
(52) U.S. Cl. .................... 430/394; 430/5; 430/311
(58) Field of Classification Search ............ 430/5, 430/311, 394; 716/19, 21; 438/128, 587
  See application file for complete search history.

(56) References Cited

U.S. PATENT DOCUMENTS

| | | | | |
|---|---|---|---|---|
| 5,424,154 A | * | 6/1995 | Borodovsky | 430/5 |
| 6,492,073 B1 | * | 12/2002 | Lin et al. | 430/5 |
| 6,596,466 B1 | * | 7/2003 | Pohland et al. | 430/313 |
| 2005/0089770 A1 | * | 4/2005 | Liu | 430/5 |
| 2006/0259893 A1 | * | 11/2006 | Fujimoto | 716/19 |
| 2007/0105387 A1 | * | 5/2007 | Blatchford et al. | 438/710 |
| 2007/0161245 A1 | * | 7/2007 | Rathsack et al. | 438/689 |
| 2008/0014684 A1 | * | 1/2008 | Blatchford et al. | 438/144 |

* cited by examiner

*Primary Examiner*—Stephen Rosasco
*Assistant Examiner*—Stewart A Fraser
(74) *Attorney, Agent, or Firm*—Warren L. Franz; Wade J. Brady, III; Frederick J. Telecky, Jr.

(57) ABSTRACT

In accordance with various embodiments, semiconductor devices and methods of forming semiconductor devices having non-rectangular active regions are provided. An exemplary method includes using a first mask to form a plurality of first features over a non-rectangular shaped active region and at least one ghost feature, wherein the plurality of first features extend beyond an edge of the non-rectangular shaped active region. The method further includes using a second mask to remove a portion of the plurality of first features extending beyond the edge of the non-rectangular shaped active region and the at least one ghost feature.

15 Claims, 5 Drawing Sheets

EDA METHODOLOGY FOR EXTENDING GHOST FEATURE BEYOND NOTCHED ACTIVE TO IMPROVE ADJACENT GATE CD CONTROL USING A TWO-PRINT-TWO-ETCH APPROACH

FIELD OF THE INVENTION

This invention relates generally to the field of integrated circuits and more specifically to a method and system for using alternating phase-shift implementation in lithographic processes.

BACKGROUND OF THE INVENTION

Conventional optical projection lithography has been the standard silicon patterning technology for the past 20 years. It is an economical process due to its inherently high throughput, thereby providing a desirable low cost per part or die produced. A considerable infrastructure (including steppers, photomasks, resists, metrology, etc.) has been built up around this technology.

In this process, a mask, or "reticle", includes a semiconductor circuit layout pattern typically formed of opaque chrome, on a transparent glass (typically $SiO_2$) substrate. A stepper includes a light source and optics/lenses that project light coming through the reticle and images the circuit pattern, typically with a 4× to 5× reduction factor, on a photoresist film formed on a silicon wafer. The term "chrome" refers to an opaque masking material that is typically but not always comprised of chrome. The transmission of the opaque material may also vary such as in the case of an attenuating phase shift mask.

In a manufacturing process using a lithographic projection apparatus, a mask can be imaged onto a substrate that is at least partially covered by a layer of resist. Prior to this imaging step, the substrate may undergo various procedures, such as, priming, resist coating, and a soft bake. After exposure, the substrate can be subjected to other procedures, such as a post-exposure bake (PEB), development, a hard bake, and a measurement/inspection of the imaged features. This array of procedures can be used as a basis to pattern an individual layer of a device, such as an IC. Such a patterned layer may then undergo various processes, such as etching, ion-implantation, doping, metallization, oxidation, chemical mechanical polishing (CMP), etc., all intended to complete an individual layer. If several layers are required, then part of all of the procedure, or a variant thereof, may need to be repeated for each new layer. Eventually, multiple devices can be present on the substrate. These devices can then be separated from one another by a technique such as dicing or sawing. Thereafter, the individual devices can be mounted on a carrier, connected to pins, etc.

The photolithography masks referred to above comprise geometric designs, also called mask features, corresponding to the circuit components or structures to be integrated onto a substrate. Layouts used to create such masks are typically generated using computer-aided design (CAD) programs, sometimes called electronic design automation (EDA). Most CAD programs follow a set of predetermined design rules in order to create functional masks. These rules are set by processing and design limitations. Design rules can define the space tolerance between circuit devices, such as, for example, gates, contact holes, or interconnect lines, so as to ensure that the circuit devices or lines do not interact with one another in an undesirable way.

One of the goals in IC fabrication is to faithfully reproduce the original circuit design or layout on the wafer using the mask. Another goal is to use as much of the wafer real estate as possible. As the size of an IC is reduced and its density increases, however, the critical dimension (CD) of its corresponding mask approaches the resolution limit of the optical exposure tool. The resolution for an exposure tool can be defined as the minimum feature sizes that the exposure tool can repeatedly expose on the wafer. The resolution value of present exposure tools often constrains the CD for many advanced IC designs.

As the semiconductor industry continues to evolve, feature sizes of the pattern are driven to smaller resolution. To meet this demand, Resolution-Enhanced optical lithography Technologies ("RET") have become popular as techniques for providing patterns with sub-wavelength resolution. These methods include off-axis illumination ("OAI"), optical proximity correction ("OPC"), and phase-shift masks ("PSMs") also called alternating phase-shift masks ("altPSMs"). Such resolution-enhanced optical lithography methods are especially useful for generating physical devices on a wafer that require small size and tight design tolerance. Examples of such physical devices are the gate length of a transistor or the dimensions of contact cuts formed in interlayer dielectrics.

One of the most common commercial implementations of phase shift mask technology is the double exposure method. A first mask, often called a binary mask, contains most of the features at the gate level. The binary mask can be printed using standard lithography techniques. A second mask, often called an alternating phase-shift mask (altPSM) includes the critical, or small sized features at the gate level.

An example of a double exposure phase shift method is illustrated in FIGS. 1A and 1B. FIG. 1A shows a layout of the mask features including the binary gate mask and phase shift features needed for each phase shift printed transistor. FIG. 1A shows a layout 100 of the overlay of a binary photomask and an altPSM over active areas 102. The binary photomask includes a series of binary gate layouts 112. The altPSM includes the phase shifters (also called shifters) 122a and 122b, where phase shifters 122a have a 0° phase shift and phase shifters 122b have a 180° phase shift. In use, a photoresist is applied to a wafer and the wafer is exposed to both masks in succession followed by photoresist development. The final transistors 132 and 134 formed using the two masks shown in FIG. 1A are shown in FIG. 1B.

In some cases, the active region can assume a shape other than rectangular. For example, FIG. 2 shows a diagram 200 of an exemplary active region 202 having an L-shape. Other exemplary active regions can include notched shaped regions. Problems arise, however, when designing using altPSM with active regions that are shaped other than a plain rectangle. One particular problem is that gate lines 212 formed over a portion of the L-shaped active region 202 have rounded ends 214, as seen in FIG. 2. Moreover, the gate lines 212 are often formed with ends 214 not extending the entire length of the active region. Among other problems, these issues can result in significant transistor leakage.

Accordingly, the present invention solves these and other problems of the prior art to provide a method that forms semiconductor devices that have gate lines with squared ends. Moreover, the present invention allows for gate lines that extend beyond the active region so as to minimize transistor leakage.

SUMMARY OF THE INVENTION

In accordance with various embodiments, a method of forming a semiconductor device is provided. The method includes using a first mask to form a plurality of first features over a non-rectangular shaped active region and at least one ghost feature, wherein the plurality of first features extend beyond an edge of the non-rectangular shaped active region. The method further includes using a second mask to remove a portion of the plurality of first features extending beyond the edge of the non-rectangular shaped active region and the at least one ghost feature.

In accordance with various embodiments, a lithography mask set is provided. The lithography mask set includes a first mask that can include first mask features that pattern features over a non-rectangular shaped active area, wherein the features extend beyond the edge of the L-shaped active area. The lithography mask further includes a second mask that can include a second mask feature to trim a In accordance with various embodiments, a computer readable medium including program code that configures a processor to perform a method of designing a lithography mask set is provided. The computer readable medium including program code can include program code for forming a first mask, the first mask comprising first mask features that pattern a plurality of lines over a non-rectangular shaped active region, wherein the plurality of lines extend beyond an edge of the non-rectangular shaped active region. The computer readable medium including program code can further include program code for forming a second mask, the second mask comprising second mask features for removing a portion of the plurality of lines extending beyond the edge of the non-rectangular shaped active region.

Additional advantages of the embodiments will be set forth in part in the description which follows, and in part will be obvious from the description, or may be learned by practice of the invention. The advantages will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate embodiments of the invention and together with the description, serve to explain the principles of the invention.

DESCRIPTION OF THE EMBODIMENTS

Figure 1A:
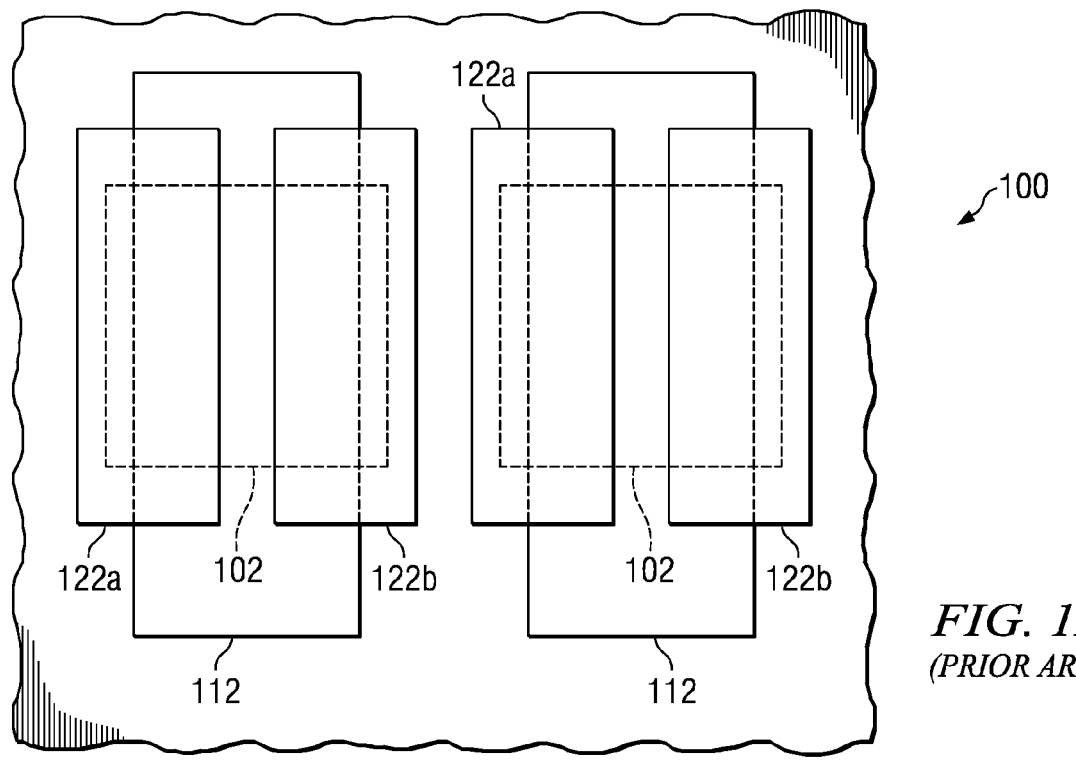
FIG. 1A is a diagram illustrating a conventional layout of an overlay of a binary photomask and an alternating phase shift photomask.
Figure 1B:
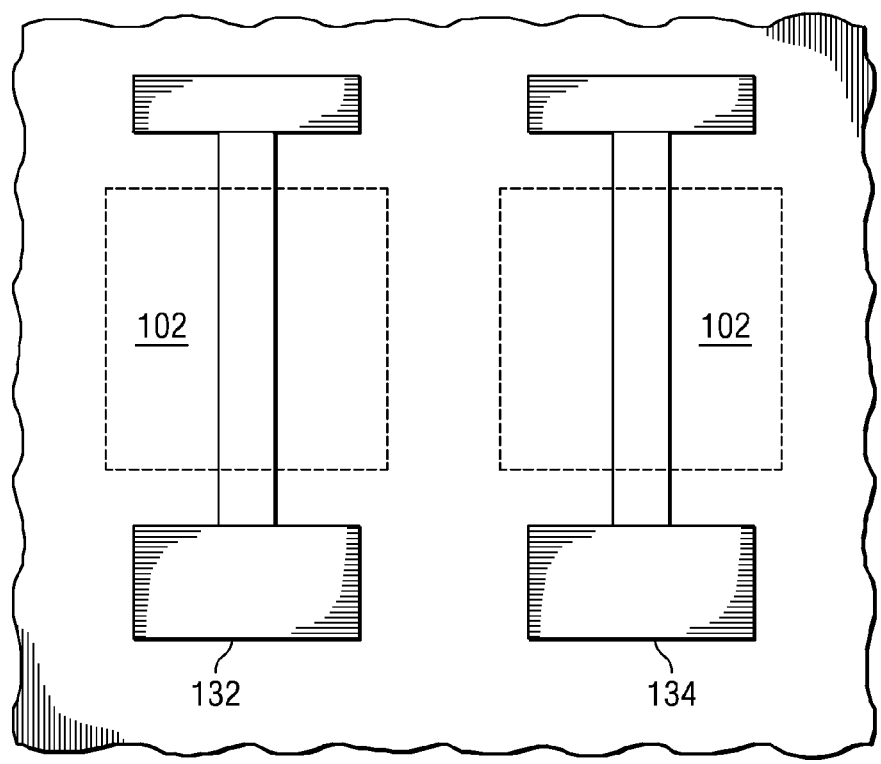
FIG. 1B. is a diagram illustrating the final structures formed using the layout shown in FIG. 1A.
Figure 2:
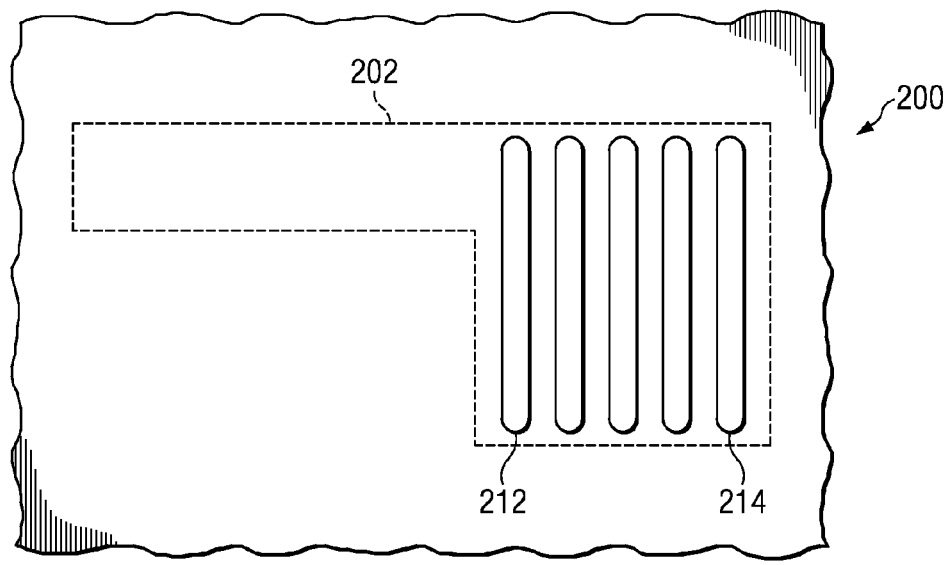
FIG. 2 is a diagram illustrating a conventional semiconductor device having a non-rectangular active region.

Reference will now be made in detail to the present embodiments, examples of which are illustrated in the accompanying drawings. Wherever possible, the same reference numbers will be used throughout the drawings to refer to the same or like parts.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

Although reference is made herein to the use of the invention in the manufacture of semiconductor devices, such as ICs, it is to be understood that the invention has many other possible applications. For example, it may be employed in the manufacture of integrated optical systems, guidance and detection patterns for magnetic domain memories, liquid crystal display panels, thin-film magnetic heads, etc. Further, one of ordinary skill in the art will appreciate that, in the context of such alternative applications, any use of the term "reticle", "wafer", or "die" in this text can be considered as being replaced by the more general terms "mask", "substrate", and "target portion", respectively.

In the present disclosure, the term "radiation" is used to include all types of electromagnetic radiation, including ultraviolet radiation (e.g., with a wavelength of, for example, 365, 248, 193, 157, or 126 nm), extreme ultraviolet radiation (e.g., with a wavelength of, for example in the range of 5 to 20 nm), and to include electrons. The term "beam" is used to encompass various types of beams including beams of radiation and beams of electrons.

The term "mask layout," as used herein, can be broadly interpreted as referring to a schematic used to make a semiconductor device. The mask layout is used to form a mask.

The term "design", as used herein, can be broadly interpreted as referring to geometric shapes on the mask layout that correspond to mask features formed on a mask and/or features formed in/on the substrate.

The term "mask," as used herein, can be broadly interpreted as referring to a device comprising mask features that can be used to endow an incoming beam with a patterned cross-section, corresponding to a target pattern, that is to be created in/on a target portion of a substrate.

The term "feature," as used herein, can be broadly interpreted as referring to an element of a semiconductor device. Examples of a feature can include a gate, a gate bus, a well, an isolation structure, an interconnect line, a space, a contact hole, a pillar, a resistor, a ghost feature, or any other element of a semiconductor device or other device as will be understood by one of ordinary skill in the art.

The term "mask feature," as used herein, can be broadly interpreted as referring to a geometric design on a mask. A mask feature can be used to pattern a feature on a substrate. A mask feature can be a resolution enhancement technique (RET) design, such as a phase shifter, a sub-resolution assist feature (SRAF), or another optical proximity correction (OPC) technique that assists in forming a feature on the substrate but is not itself formed on the substrate. Still further, multiple mask features can be used to form structures on the substrate. The multiple structures, when finally formed, can combine to form a desired feature.

The term "ghost feature" (also referred to herein as ghost polysilicon, ghost poly, ghost gate, or ghost poly gate), as used herein, can be broadly interpreted as referring to a structure used to improve the critical dimension control when forming semiconductor devices by removing or minimizing the differences in OPC and responses to process variations. Ghost features can be structures initially formed on a substrate but later removed. In most cases, the ghost features are formed next to a feature that remains on the on the substrate. For example, a ghost feature, such as a ghost gate, can be formed at the end of a gate array so that the environment at the end of the gate array is similar to the environment in the interior of the gate array. Generally, the environment can include, for example, feature pitch and how well the printed feature size and/or shape conform to the intent of the original mask layout.

Ghost features can be used to reduce the critical dimension variation, such as, for example, for gates at the end of a gate array. For example, when using ghost gates, the critical dimension of gates at the end of the gate array (i.e., the last gate in an array for gates) can be from about 0% to about 10% more than the critical dimension of gates in the interior of the array. This is a significant improvement over current methods that do not use ghost features, where features, such as the last gates in the array, are two to three times the size of gates at the interior of the gate array. Moreover, because ghost features are removed from the wafer, they are not subject to further processing steps that include additional design restrictions and can lead to detrimental device interference.

Ghost features can be made of the same material as the other features concurrently formed. In the case of an array of gates made from a layer of polysilicon, for example, the ghost gate can be formed from the same layer of polysilicon. In other instances, however, where the layer is made of another material, such as a metal, a semiconductor, or an insulator, the ghost feature can be made of that material.

The term "substrate" as used herein can be broadly interpreted to include any suitable material, for example, single crystalline silicon, sapphire, gallium arsenide, polycrystalline materials, insulators, metals, or the like. The substrate may contain various features and various layers.

According to various embodiments a computer readable medium can be used to generate at least a portion of the integrated circuit. The computer readable medium can comprise program code that can configure a processor to perform various steps used to make the integrated circuit.

Figure 3B:
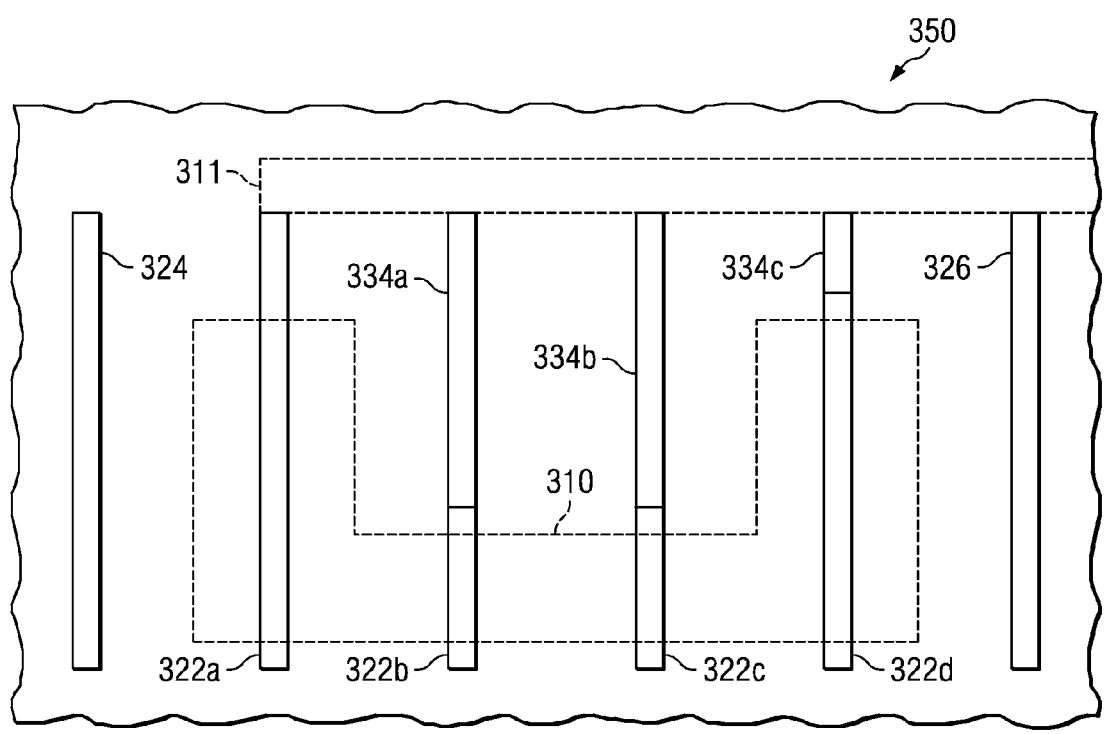
FIG. 3B is a top-down view of a portion of a semiconductor device after use of the first mask shown in FIG. 3A.
Figure 3A:
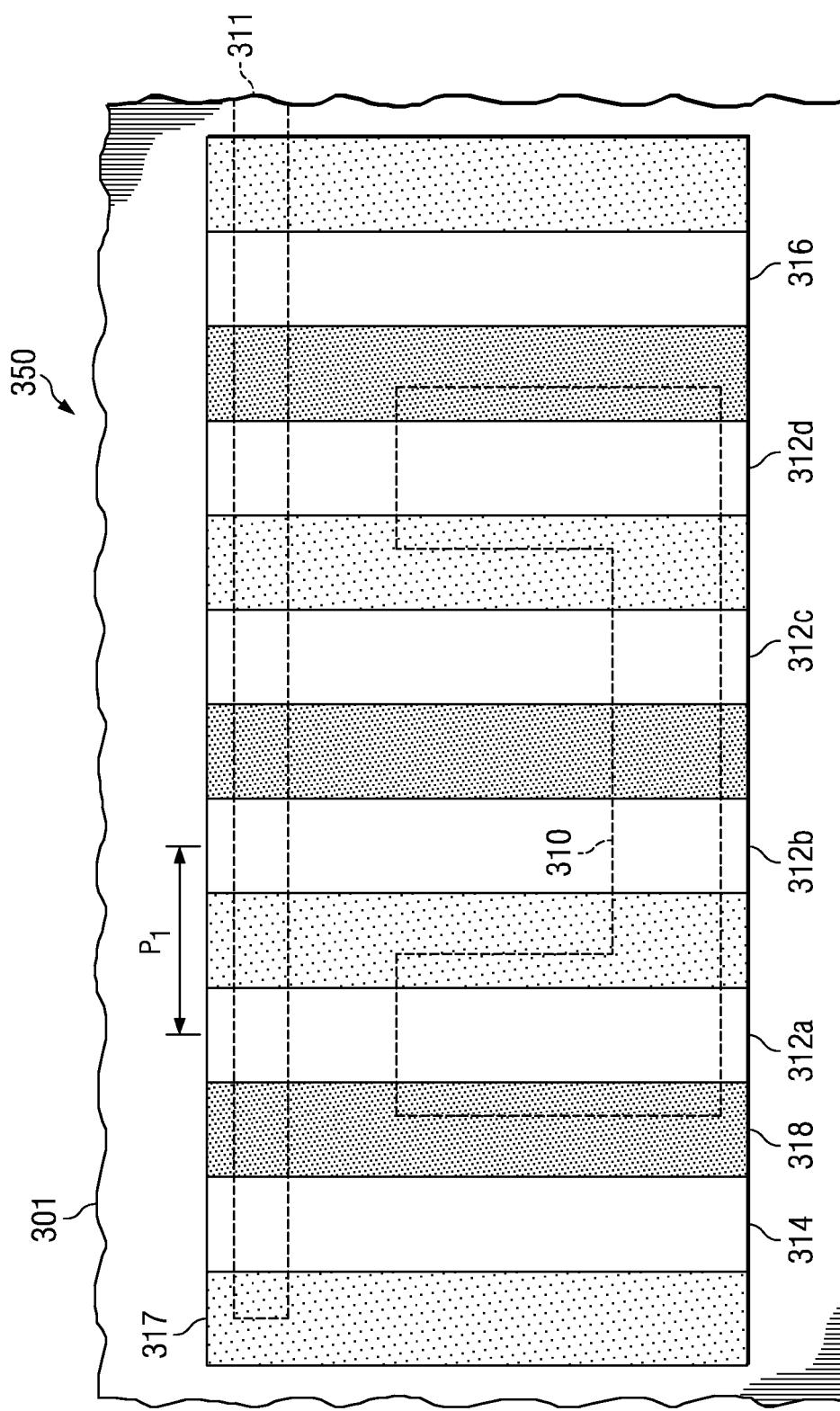
FIG. 3A is a top-down view of a portion of a first mask superimposed over an image of a non-rectangular shaped active region.
Figure 3C:
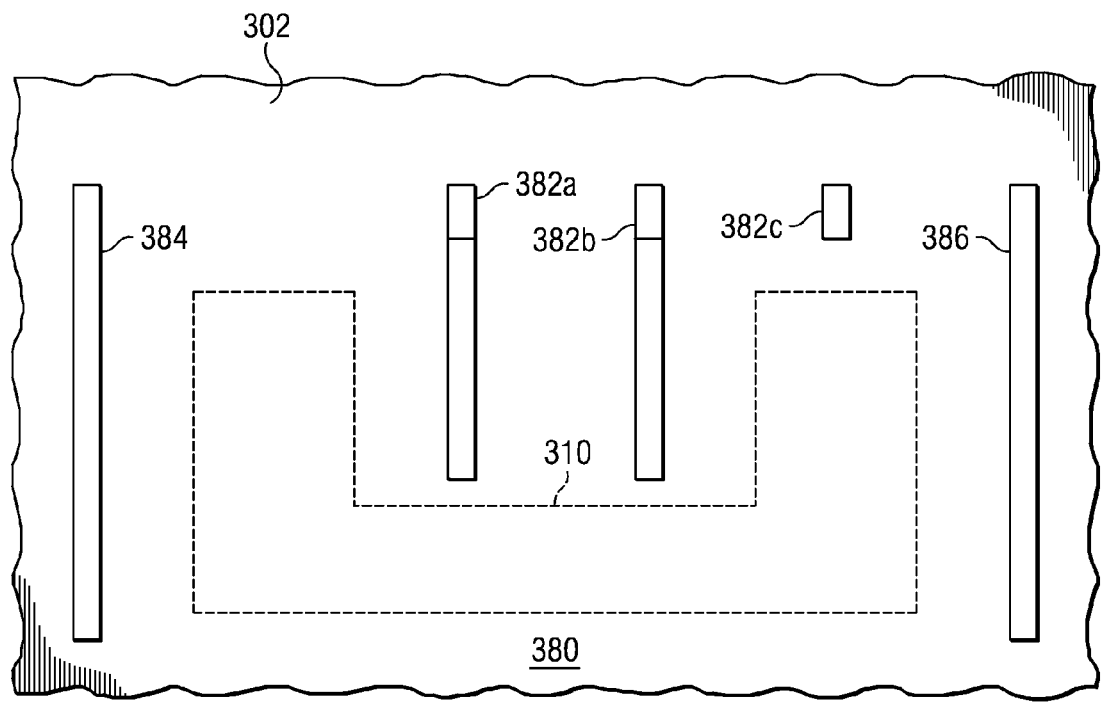
FIG. 3C is a top-down view of the portion of a second mask superimposed over the image of the non-rectangular shaped active region shown in FIG. 3A.
Figure 3D:
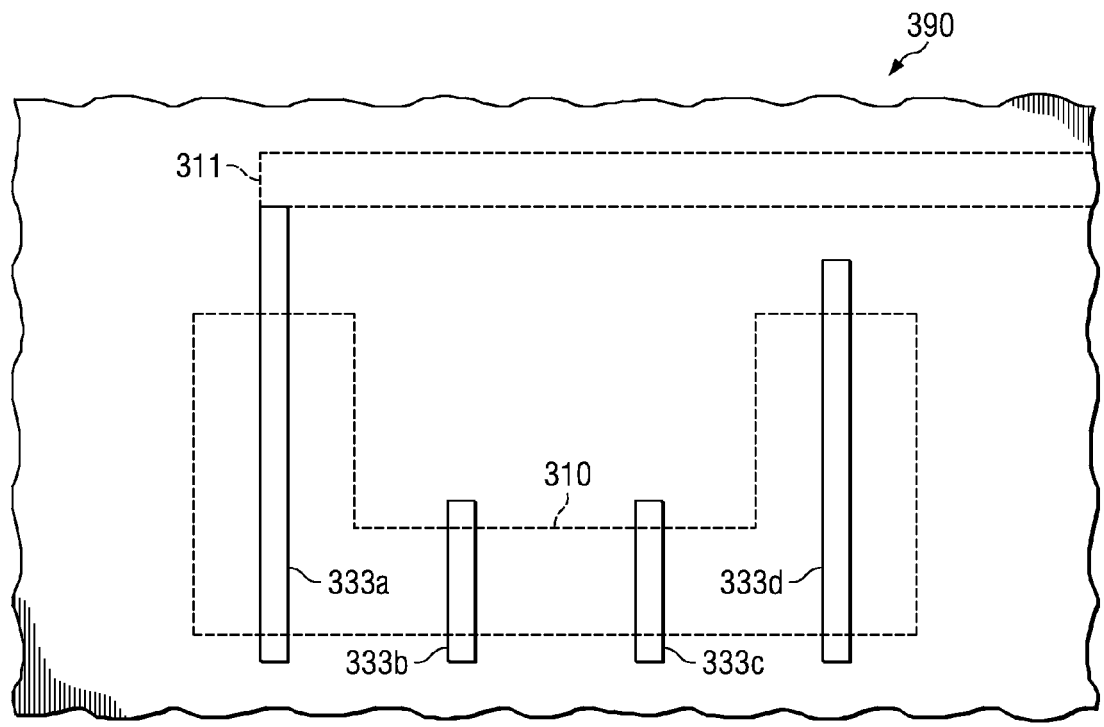
FIG. 3D is a top-down view of a portion of a semiconductor device formed after using the first and second masks shown in FIGS. 3B and 3C.
Figure 4:
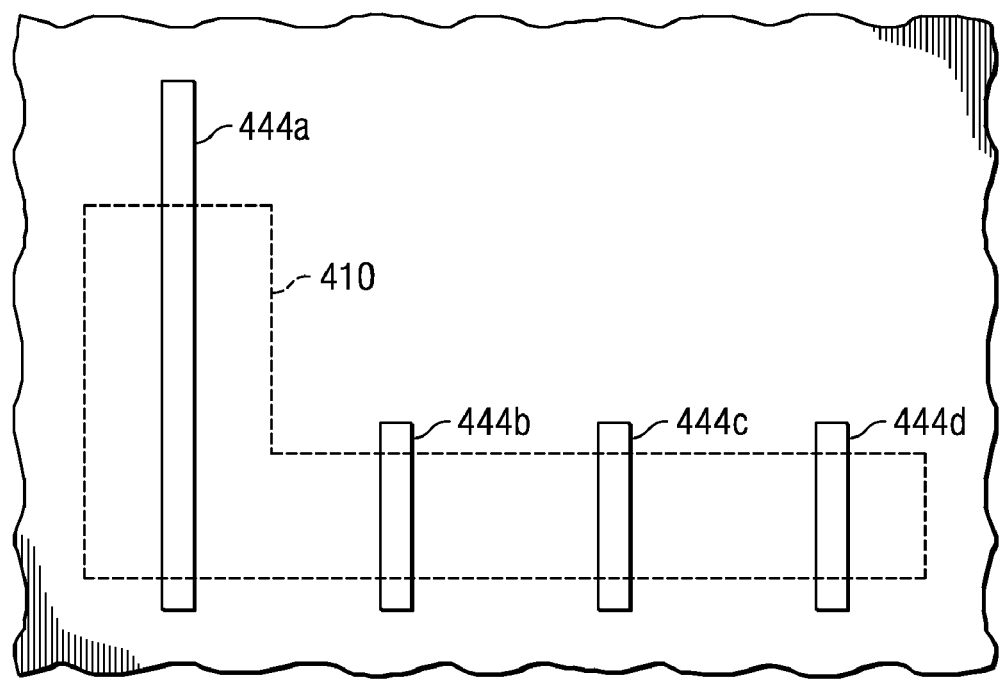
FIG. 4 is a top-down view of a portion of gate structures formed over an L-shaped active region in accordance with the present teachings.
Figure 5:
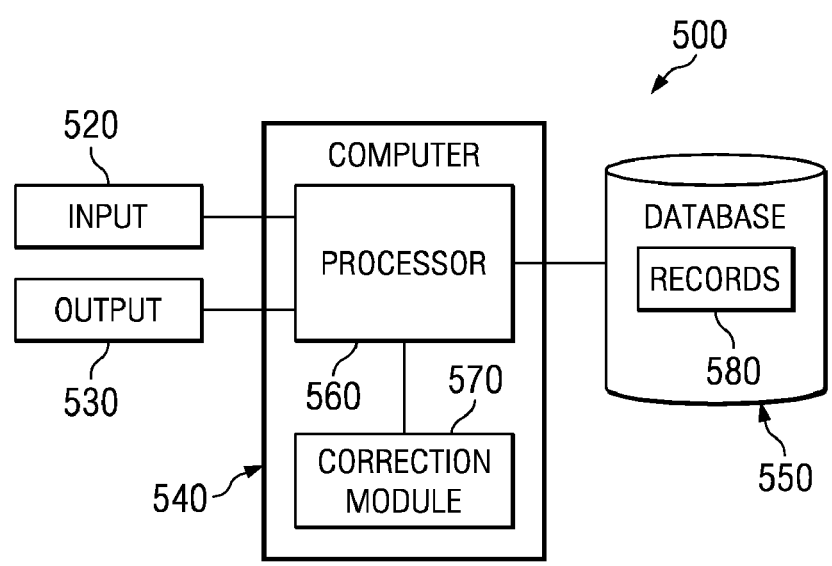
FIG. 5 illustrates a system for designing and correcting a photomask according to the present teachings.

Embodiments of the present invention and its advantages are best understood by referring to FIGS. 3-5, like numerals being used for like and corresponding parts of the various drawings.

FIGS. 3-5 depict an exemplary altPSM method and device that is used to form features on a substrate. One or ordinary skill in the art, however, will understand that the disclosed method can also be used with attenuated PSM (attPSM) and binary mask methods to form features on a substrate. FIG. 3A is a top view of a portion of a first mask 301. Mask 301 of FIG. 3A is shown superimposed over the image of an active region 310 and a field polsilicon routing 311. The first mask can include a first plurality of opaque areas 312a-312d that define first features, such as, for example, a plurality of gates. The gates can be spaced apart at a pitch $P_1$, and the opaque areas can be chrome areas that do not allow for the transmission of radiation. Moreover, the width of the opaque areas can be variable and can control, for example, the width of the gate structures. According to various embodiments, the first plurality of opaque areas 312a-312d can be placed over the boundary between a 0 degree phase area and a 180 degree phase area. FIG. 3A shows a plurality of 0 degree phase areas 317 and a plurality of 180 degree phase areas 318. Generally, 0 degree phase areas 317 are disposed adjacent to 180 degree phase areas 318. These clear phase shift areas allow light to pass through such that destructive interference occurs at the boundary between the areas. For example, 180 degree phase areas 318 can have a thickness so that it creates destructive interference at its boundary with 0 degree phase areas 317.

The first mask 301 can also include one or more second opaque areas 314 and 316 that define one or more ghost features. A ghost feature can be positioned adjacent to one or both end gates of the plurality of gates. Ghost features can be spaced apart from an end gate at a pitch $P_1$ or spaced at a pitch other than $P_1$. Second plurality of opaque areas 314 and 316 can comprise, for example, chrome that does not allow for the transmission of radiation. According to various embodiments, the second plurality of opaque areas 314 and 316 can be placed over the boundary between a 0 degree phase area and a 180 degree phase area. The ghost features defined by the second opaque areas 314 and 316 can be disposed at one or both ends of the first plurality of opaque areas that define the plurality of gates.

According to various embodiments, the active region 310 can have a non-rectangular shape, such as an L-shape or a notched shape. Non-rectangular active regions, such as the L-shape and the notched shape can be used to reduce the physical layout area in order to allow more chips per wafer. Furthermore, because the size and shape of the active area can affect the speed and timing, non-rectangular active regions can provide flexibility in achieving circuit design requirements. In many cases, the non-rectangular active region 310 can be formed prior to forming the features, such as the gate structures, on the substrate.

As shown in FIG. 3B, first mask 301 can be used to define a plurality of first features 322a-322d and the at least one ghost feature 324 and 326 on a surface, for example, a photosensitive layer coating a polysilicon layer, by exposing the first mask to a light. Using etching techniques known to one of ordinary skill in the art, a portion of the polysilicon layer disposed under the photosensitive layer can be removed to form the plurality of first features 322a-322d and the at least one ghost feature 324 and 326.

Referring to FIG. 3B, the plurality of features, such as gate structures 322a-322d can be formed over the notched shaped active region 310. To improve lithography resolution, ghost features 324 and 326 can be formed at the end of the gate array. Moreover, the ghost features 324 and 326 can be identical to the gate structures 322a-322d. According to various embodiments, the gate structures 322a-322d and the ghost features 324 and 326 can be the same length when formed.

FIG. 3C is a top view of a portion of a second mask 302 aligned, for example, to protect the gate structures formed by first mask 301, and to remove ghost features 324 and 326. Second mask 302 can also be used to remove portions of the gate structures 322a-322d that extend beyond the edges of the notch of the notch shaped active region 310. For example, as shown in FIG. 3B, regions 334a-334c are portions of gate structures 322b-322d that extend into the field polysilicon routing 311. Second mask 302, shown superimposed over active region 310, can include an opaque area 380 to protect the other portions of the gate areas formed using first mask 301 from exposure to light. The second mask 302 can further include clear areas 384 and 386 that can allow transmission of light. In various embodiments, other clear areas 382a-382c can be included and can be used to remove portions 334a-334c of the gate structures that extend beyond the edges of the notch shaped active region 310. Moreover, clear areas 384 and 386 can be used to remove ghost features 324 and 326 from the pattern. For example, predetermined portions of a photoresist on the substrate can be exposed to radiation through the clear areas. Subsequently, the exposed areas can be removed using, for example, an etch back process. According to various embodiments, extending the ghost features 324 and 326 and extending the gate structures 333a-333d beyond the edges of the active region can improve critical dimension control of adjacent gates.

According to various embodiments, removing portions of the gate structures as described herein enables the gate structures to be etched back in a square fashion to a targeted extension beyond the active region as shown, for example, in FIG. 3D. FIG. 3D shows a resultant image 390 after exposure by first mask 301 and second mask 302, and the corresponding removal steps. Resultant image 390 can include a plurality of gates 333a-333d. Active region 310 and field poly routing 311 are also shown in FIG. 3D. According to various embodiments, gates 333a-333d can form an array of gates in which each gate is formed at a predetermined pitch. Pitch (also called contacted pitch) for the 45 nm logic node can be from about 160 nm to about 190 nm. For the 90 nm logic node, the pitch can be about 300 nm to about 360 nm. The embodiments of the invention described herein, are particularly well suited to logic nodes of less than about 1 μm.

Although shown as a straight bar, plurality of gate structures 333a-333d can be other than a straight bar and can have, for example, a complex geometry made up of multiple shapes. The multiple shapes, when patterned onto the underlying layer, can combine to form a desired feature.

It will be understood to one of ordinary skill in the art that features, such as gate structures 444a-444d can be formed to extend beyond the edges of any shaped active region such as, for example, the L-shaped active region 410 shown in FIG. 4. Moreover, it will be understood that ghost features can be formed adjacent to a gate structure so as to improve the critical dimension control of the gate structures.

FIG. 5 illustrates a system 500 that can be used to design and correcting a mask pattern, such as a pattern on a phase photomask and/or a trim photomask described herein. System 500 includes an input device 520 and an output device 530 coupled to a computer 540, which is in turn coupled to a database 550. Input device 520 may comprise, for example, a keyboard, a mouse, or any other device suitable for transmitting data to computer 540. Output device 530 may comprise, for example, a display, a printer, or any other device suitable for outputting data received from computer 540.

Computer 540 may comprise a personal computer, workstation, network computer, wireless computer, or one or more microprocessors within these or other devices, or any other suitable processing device. Computer 540 may include a processor 560 and a correction module 570. Processor 560 controls the flow of data between input device 520, output device 530, database 550, and correction module 570. Correction module 570 may receive descriptions of a contour and an uncorrected pattern and can compute a corrected pattern that may be used to define the contour.

Database 550 may comprise any suitable system for storing data. Database 550 may store records 580 that include data associated with the layouts. A record 580 may be associated with a segment of the layout.

While the examples given have been with respect to patterning transistor gates over diffusion regions, the methods and systems described herein may also be used to correct patterns of other layers of integrated circuits. For example, the interconnect parts of a metal pattern may be divided into base and relational segments for improved critical dimension correction, leaving the corners and contact/via pads to be corrected as traditional placement-correction segments.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising."

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of forming a semiconductor device comprising:
    providing a semiconductor substrate including a non-rectangular active region;
    forming a first mask pattern on the semiconductor substrate, the first mask pattern defining a plurality of elongated gate structures of like width and predetermined pitch;
    etching a first portion of the substrate using the first mask pattern to form the defined plurality of elongated gate structures on the substrate, the gate structures extending transversely over the active region; the gate structures being defined and formed so that all of the gate structures extend at least for targeted extension distances beyond the active region, and some of the gate structures extend beyond the active region for portions greater than the targeted extension distances;
    forming a second mask pattern on the semiconductor substrate, the second mask pattern defining the portions greater than the targeted extension distances of the some of the gate structures; and
    etching a second portion of the substrate using the second mask pattern to remove the defined portions greater than the targeted extension distances from the formed gate structures.

2. The method of claim 1, wherein the first mask pattern further defines one or more ghost features positioned adjacent to end ones of the gate structures.

3. The method of claim 2, wherein etching the first portion of the substrate forms the defined one or more ghost features adjacent to end ones of the formed gate structures;

the second mask pattern defines the one or more ghost features; and etching the second portion of the substrate removes the formed one or more ghost features.

4. The method of claim 3, wherein the one or more ghost features and the plurality of gate structures have like widths.

5. The method of claim 4, wherein the one or more ghost features are spaced at the predetermined pitch from the adjacent end ones of the gate structures.

6. The method of claim 1, wherein forming at least one of the first or second mask patterns on the substrate comprises forming a photosensitive layer over the substrate, and exposing the photosensitive layer with a photolithography mask; and wherein a corresponding at least one of etching the first or second portions of the substrate comprises etching through the exposed photosensitive layer.

7. The method of claim 1, wherein the non-rectangular shaped active region comprises an L-shaped or a notch shaped active region.

8. The method of claim 1, wherein the substrate comprises silicon; and
wherein etching the second portion of the substrate removes portions of gate structure formed by etching the first portion that extend into a field polysilicon routing region of the substrate.

9. The method of claim 1, wherein the gate structures are straight bar structures.

10. A method of forming a semiconductor device comprising:
providing a semiconductor substrate including a non-rectangular active region having a notch therein;
forming a first mask pattern on the semiconductor substrate, the first mask pattern defining a plurality of elongated gate structures of like width and predetermined pitch;
etching a first portion of the substrate using the first mask pattern to form the defined plurality of elongated gate structures on the substrate, the gate structures extending transversely over the active region; the gate structures being defined and formed so that all of the gate structures extend at least for targeted extension distances beyond the active region, and the gate structures at the notch extend beyond the active region for portions greater than the targeted extension distances;
forming a second mask pattern on the semiconductor substrate, the second mask pattern defining the portions greater than the targeted extension distances of the gate structures at the notch; and
etching a second portion of the substrate using the second mask pattern to remove the defined portions greater than the targeted extension distances from the gate structures formed at the notch.

11. The method of claim 10, wherein forming at least one of the first or second mask patterns on the substrate comprises forming a photosensitive layer over the substrate, and exposing the photosensitive layer with a photolithography mask; and wherein a corresponding at least one of etching the first or second portions of the substrate comprises etching through the exposed photosensitive layer.

12. The method of claim 11, wherein the gate structures are straight bar structures.

13. The method of claim 10, wherein the first mask pattern further defines one or more ghost features positioned adjacent to end ones of the gate structures; etching the first portion of the substrate forms the defined one or more ghost features adjacent to end ones of the formed gate structures; the second mask pattern defines the one or more ghost features; and
etching the second portion of the substrate removes the formed one or more ghost features.

14. The method of claim 13, wherein the one or more ghost features and the plurality of gate structures have like widths; and the one or more ghost features are spaced at the predetermined pitch from the adjacent end ones of the gate structures.

15. A method of forming a semiconductor device comprising:
providing a semiconductor substrate including a non-rectangular active region having a notch therein;
forming a first mask pattern on the semiconductor substrate by forming a photosensitive layer over the substrate and exposing the photosensitive layer with a photolithography mask; the first mask pattern defining a plurality of straight bar gate structures and ghost structures of like width and predetermined pitch;
etching a first portion of the substrate using the first mask pattern to form the defined plurality of straight bar gate structures and ghost structures on the substrate, the gate structures extending transversely over the active region; the gate structures being defined and formed so that all of the gate structures extend at least for targeted extension distances beyond the active region, and the gate structures at the notch extend beyond the active region for portions greater than the targeted extension distances;
forming a second mask pattern on the semiconductor substrate, the second mask pattern defining the portions greater than the targeted extension distances of the gate structures at the notch and defining the ghost features; and
etching a second portion of the substrate using the second mask pattern to remove the defined portions greater than the targeted extension distances from the gate structures formed at the notch and to remove the ghost features.

* * * * *